United States Patent
Zhu

(10) Patent No.: US 11,695,075 B2
(45) Date of Patent: Jul. 4, 2023

(54) THIN FILM TRANSISTOR AND MANUFACTURING METHOD THEREOF, ARRAY SUBSTRATE AND DISPLAY DEVICE

(71) Applicant: BOE Technology Group Co., Ltd., Beijing (CN)

(72) Inventor: Xiaming Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/909,017

(22) Filed: Jun. 23, 2020

(65) Prior Publication Data

US 2020/0411696 A1   Dec. 31, 2020

(30) Foreign Application Priority Data

Jun. 28, 2019   (CN) .......................... 201910579865.0

(51) Int. Cl.
*H01L 29/786* (2006.01)
*H01L 27/12* (2006.01)
*H01L 29/66* (2006.01)

(52) U.S. Cl.
CPC .... *H01L 29/78618* (2013.01); *H01L 27/1222* (2013.01); *H01L 29/66742* (2013.01)

(58) Field of Classification Search
CPC .......... H01L 29/78618; H01L 27/1222; H01L 29/66742; H01L 29/78645; H01L 29/78696; H01L 29/42384; H01L 29/41
See application file for complete search history.

(56) References Cited

U.S. PATENT DOCUMENTS

| | | | |
|---|---|---|---|
| 9,799,752 B1 * | 10/2017 | Nelson | H01L 29/401 |
| 2018/0151650 A1 * | 5/2018 | Ha | G09G 3/3685 |
| 2019/0189974 A1 * | 6/2019 | Gunji | H10K 59/122 |
| 2019/0280070 A1 * | 9/2019 | Gu | H01L 29/78648 |

FOREIGN PATENT DOCUMENTS

| | | | | |
|---|---|---|---|---|
| CN | 104779171 A | * | 7/2015 | ....... H01L 21/30604 |
| CN | 104779171 A | | 7/2015 | |
| CN | 104900709 A | * | 9/2015 | ......... H01L 29/1037 |
| CN | 104900709 A | | 9/2015 | |
| CN | 108364961 A | * | 8/2018 | |
| CN | 108364961 A | | 8/2018 | |
| CN | 109713043 A | * | 5/2019 | ............. H01L 21/34 |
| CN | 109713043 A | | 5/2019 | |
| WO | 2013172143 A1 | | 11/2013 | |
| WO | WO-2013172143 A1 | * | 11/2013 | ......... H01L 51/0529 |

OTHER PUBLICATIONS

Chinese First Office Action dated Dec. 22, 2021 corresponding to application No. 201910579865.0.

* cited by examiner

*Primary Examiner* — Edward Chin
(74) *Attorney, Agent, or Firm* — Nath, Goldberg & Meyer; Joshua B. Goldberg

(57) ABSTRACT

The disclosure provides a thin film transistor, a method of manufacturing the thin film transistor, an array substrate and a display device, belongs to the field of display technology, and can solve the problem that an existing thin film transistor is prone to cracking or breaking due to bending. The thin film transistor of the present disclosure includes a substrate and an active layer arranged on the substrate, and at least one groove is arranged on a surface of the active layer distal to the substrate.

16 Claims, 5 Drawing Sheets

THIN FILM TRANSISTOR AND MANUFACTURING METHOD THEREOF, ARRAY SUBSTRATE AND DISPLAY DEVICE

CROSS-REFERENCE TO RELATED APPLICATION

The present application claims the priority of the Chinese Patent Application No. 201910579865.0, filed on Jun. 28, 2019, the disclosure of which is incorporated herein by reference in its entirety.

TECHNICAL FIELD

The present disclosure relates to the field of display technology, and in particular to a thin film transistor, a manufacturing method thereof, an array substrate and a display device.

BACKGROUND

The bendable substrate is widely concerned about due to the bendable performance of the bendable substrate, and is applied to the technical fields of bendable mobile phones, wearable equipment and the like.

SUMMARY

The present disclosure provides a thin film transistor, a manufacturing method thereof, an array substrate and a display device.

An embodiment of the present disclosure provides a thin film transistor, which includes a substrate and an active layer disposed on the substrate, and a surface of the active layer distal to the substrate is provided with at least one groove, and a depth of the at least one groove penetrating through the active layer is larger than half of a thickness of the active layer in a direction perpendicular to the substrate.

In an embodiment, the thin film transistor further includes a first electrode and a second electrode; the active layer includes two contact parts respectively in contact with the first electrode and the second electrode, and a middle part positioned between the two contact parts; orthographic projections of the two contact parts on the substrate are not overlapped with an orthographic projection of the middle part on the substrate; and the at least one groove is disposed in the middle part.

In an embodiment, the at least one groove is of a stripe shape extending in an extension direction perpendicular to a direction pointing from the first electrode to the second electrode; and a distance between a bottom of the at least one groove and a plane where a side of the active layer proximal to the substrate is located is larger than 0, a conductivity enhancement structure is arranged between the bottom of the at least one groove and the side of the active layer proximal to the substrate, the conductivity enhancement structure has a conductivity larger than that of other portions of the middle part, and an orthographic projection of the conductivity enhancement structure on the substrate is located in a range of an orthographic projection of the at least one groove on the substrate.

In an embodiment, the at least one groove is a stripe shape extending in an extension direction perpendicular to a direction pointing from the first electrode to the second electrode; and the at least one groove penetrates through the active layer, and a conductivity enhancement structure is filled at a bottom of the at least one groove.

In an embodiment, the conductivity enhancement structure includes a conductorized semiconductor material.

In an embodiment, the at least one groove includes a plurality of grooves, which are arranged at intervals along a direction pointing from the first electrode to the second electrode.

In an embodiment, the thin film transistor further includes a gate insulating layer disposed on a side of the active layer distal to the substrate and a gate electrode disposed on a side of the gate insulating layer distal to the substrate, and an orthographic projection of the gate electrode on the substrate is not overlapped with an orthographic projection of the at least one groove on the substrate.

In an embodiment, the at least one groove has a width direction perpendicular to the extension direction, and a dimension of the at least one groove in the width direction is in a range of 8 nm to 500 nm.

In an embodiment, the thin film transistor further includes a gate insulating layer on a side of the active layer distal to the substrate, and a gate electrode on a side of the gate insulating layer distal to the substrate, and an overlapping portion between an orthographic projection of the gate insulating layer on the substrate and an orthographic projection of the at least one groove on the substrate is located in the at least one groove.

In an embodiment, a material of the gate insulating layer includes one or a combination of aluminum oxide ($Al_2O_3$), silicon oxide ($SiO_2$), zirconium oxide ($ZrO_2$), hafnium oxide ($HfO_2$) and titanium oxide ($TiO_2$), and a thickness of the gate insulating layer is in a range of 5 nm to 50 nm.

In an embodiment, the at least one groove is filled with an organic insulating material.

In an embodiment, the thin film transistor further includes an interlayer insulating layer on a side of the gate electrode distal to the substrate, and a first electrode and a second electrode on a side of the interlayer insulating layer distal to the substrate, and the first electrode and the second electrode are electrically coupled to the active layer through via holes in the active layer respectively.

The present disclosure further provides an array substrate including a plurality of thin film transistors, and each of the plurality of thin film transistors is the above thin film transistor.

In an embodiment, the substrate is a bendable substrate and is provided with a preset bendable direction, and an extension direction of the at least one groove is perpendicular to the preset bendable direction.

The present disclosure further provides a display device, including the above array substrate.

The present disclosure provides a method for manufacturing a thin film transistor, including: preparing a substrate; and forming an active layer on the substrate such that a surface of the active layer distal to the substrate is provided with at least one groove, and a depth of the at least one groove penetrating through the active layer is larger than half of a thickness of the active layer in a direction perpendicular to the substrate.

In an embodiment, the forming the active layer includes forming the at least one groove on the surface of the active layer distal to the substrate by a nano-imprint lithography process.

In an embodiment, the method further includes forming a gate insulating layer on the active layer to conform to the active layer and form at least one groove on a surface of the gate insulating layer distal to the substrate; filling the at least one groove on the surface of the gate insulating layer with an organic insulating material and planarizing the organic insulating material; and forming a gate electrode.

In an embodiment, the method further includes forming a gate insulating layer on the active layer to conform to the active layer and form at least one groove on a surface of the gate insulating layer distal to the substrate; filling the at least one groove on the surface of the gate insulating layer with an organic insulating material, and planarizing the organic insulating material to form a planarized organic insulating material layer; forming a gate material layer on the planarized insulating material layer; processing the gate material layer by a nano-imprint lithography process to form a gate electrode, an orthographic projection of which on the substrate is not overlapped with an orthographic projection of the at least one groove on the substrate and expose the gate insulation layer in the at least one groove; and forming an interlayer insulating layer on the gate electrode and the exposed gate insulating layer.

In an embodiment, after forming an active layer on the substrate such that a surface of the active layer distal to the substrate is provided with at least one groove, the method further includes: enhancing conductivity of a portion of the active layer under the at least one groove such that the portion of the active layer has a higher conductivity than that of its surrounding portions.

DETAILED DESCRIPTION

In order to make those skilled in the art better understand the technical solutions of the present disclosure, a thin film transistor, a method for manufacturing the thin film transistor, an array substrate and a display device provided in the present disclosure are described in further detail below with reference to the accompanying drawings and the detailed description.

Noun Explanation

In the present disclosure, unless otherwise specified, the following technical terms should be understood according to the following explanations:

The term "stacked arrangement" of a plurality of film layers means that the plurality of film layers are sequentially formed in a certain order, but does not represent that they have a spatial stacking relationship in all positions, nor that they contact each other.

A layer A is above a layer B, meaning that the layer A is formed after the layer B, so the layer A is further from the substrate than the layer B in a laminated relationship, but this does not mean that the layer B is superposed on the layer A in all positions, e.g., the layer B may be provided in a position where the layer A is not present.

At present, a bending degree of the bendable substrate is limited, and for example, the bendable substrate cannot be bent to have a curvature radius of less than 1 mm. One reason for the limitation is that in the process of bending the bendable substrate, stress generates in the film layers of various structures in the driving circuit located in the bending region of the bendable substrate, and the greater the bending degree of the bendable substrate is, the greater the stress generated in the film layers is, so that when the bendable substrate is bent to a greater degree, the film layers (especially, the inorganic film layers) are easily cracked or broken, thereby causing deterioration or failure of the electrical performance of the driving circuit.

Figure 2:
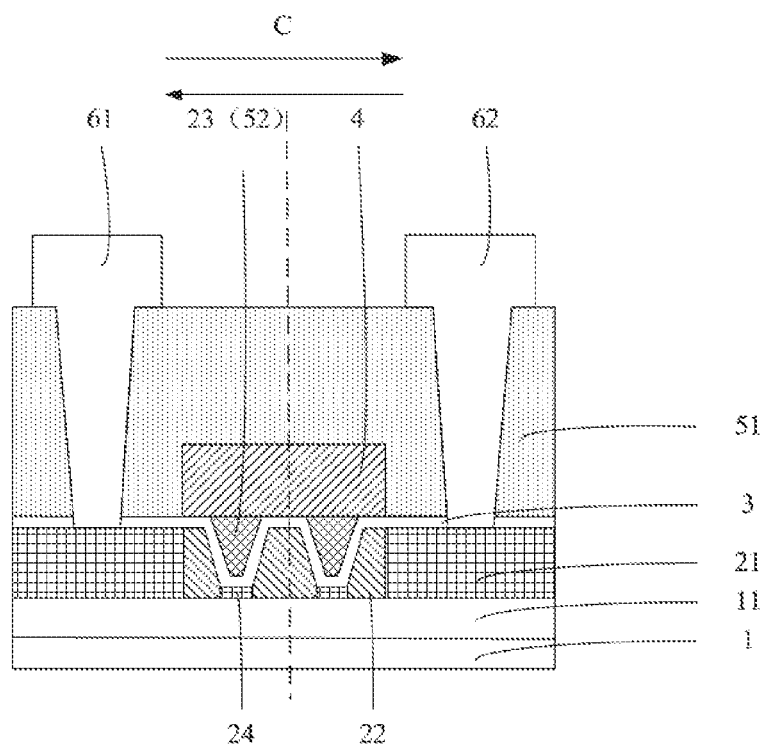
FIG. 2 is a schematic view of a structure of a thin film transistor according to an embodiment of the present disclosure.
Figure 3:
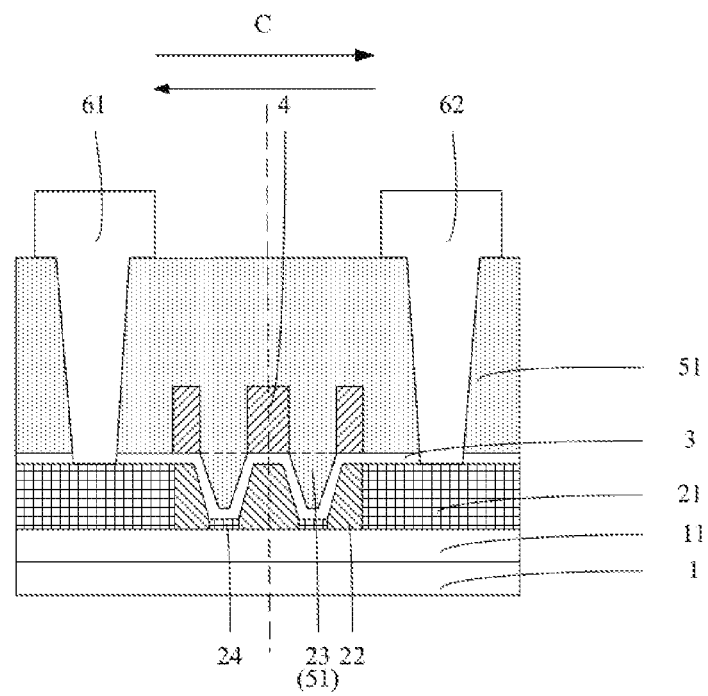
FIG. 3 is a schematic view of a structure of a thin film transistor according to an embodiment of the present disclosure.
Figure 4:
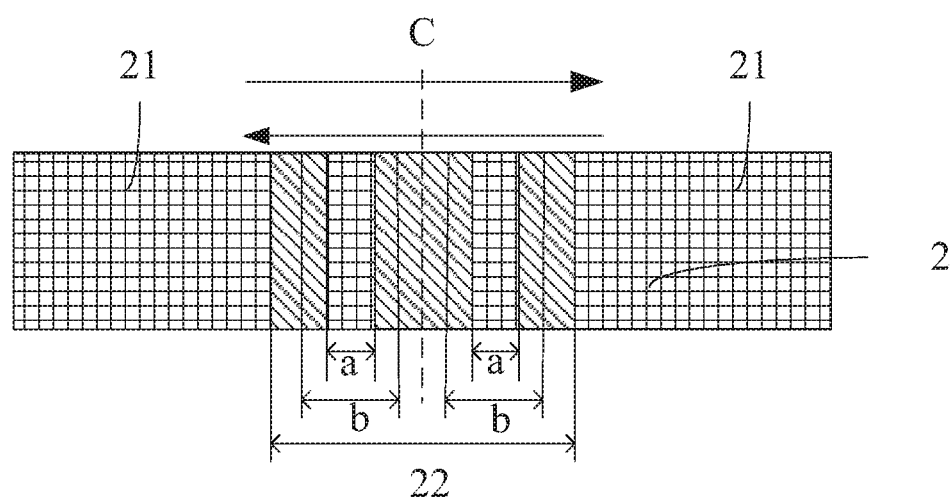
FIG. 4 is a schematic top view of a structure of a thin film transistor according to an embodiment of the present disclosure.

Referring to FIGS. 2 to 4, embodiments of the present disclosure provide a thin film transistor including: a substrate and an active layer 2 arranged on the substrate, and at least one groove 23 is arranged on the surface of the active layer 2, which is distal to the substrate.

The inventor finds that when the substrate of the thin film transistor is bent, the film layer near the bending region will deform and generate bending stress due to an external force, so that the film layer near the bending region is squeezed or stretched, the active layer 2 of the thin film transistor is usually made of an inorganic material, and the inorganic material has great brittleness, so that the active layer 2 is easily cracked or broken after being subjected to multiple bending stresses, and the thin film transistor is degraded or failed.

In the embodiments of the present disclosure, on one hand, the at least one groove 23 (e.g., a stress relief groove) reduces a thickness of the active layer 2 at a position where the groove is located, so when the active layer 2 is bent, the bending stress generated by the groove is smaller than other portions of the active layer 2 without the groove; on the other hand, the at least one groove 23 increases a surface area of the active layer 2, so that when the active layer 2 is bent, the bending stress generated by the groove can be released in a larger area range, thereby reducing the bending stress per unit area; therefore, the at least one groove 23 can reduce the probability of cracks or fractures of the active layer 2, and improve the bending resistance of the thin film transistor.

Figure 1:
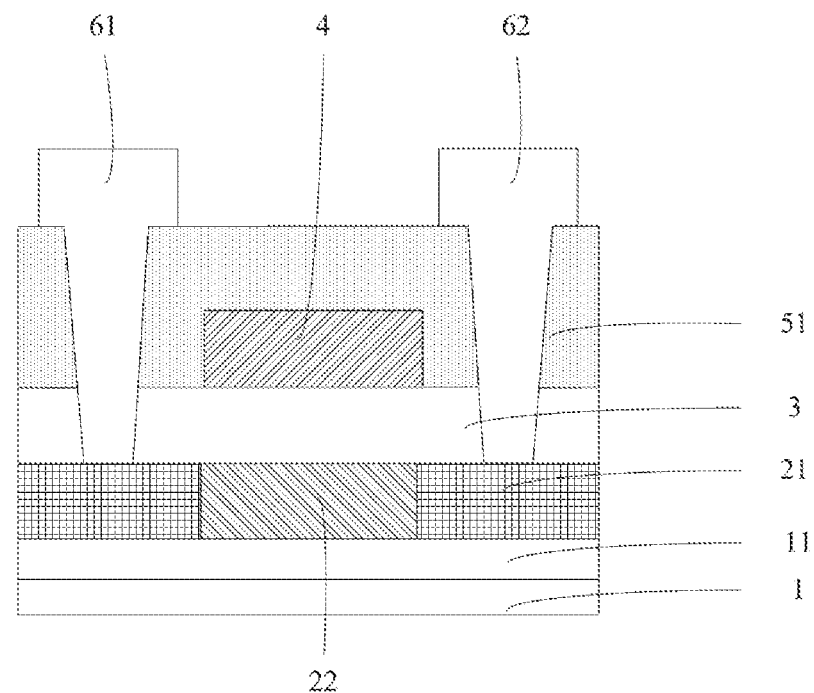
FIG. 1 is a schematic view of a structure of a thin film transistor in the related art.

Referring to FIG. 1, a buffer layer 11, an active layer 2, a gate insulating layer 3, a gate electrode 4, an interlayer insulating layer (ILD) 51, and a first electrode 61 and a second electrode 62 (i.e., a source electrode and a drain electrode) disposed on the interlayer insulating layer 51 and the like may be stacked on a substrate of the thin film transistor in the related art.

Herein, the active layer 2 includes two contact parts (ohmic contact regions) 21 corresponding to the first electrode 61 and the second electrode 62, respectively, and a middle part (channel region) 22 between the two contact parts (ohmic contact regions) 21.

On the basis of the thin film transistor shown in FIG. 1, the at least one groove 23 provided on the side of the active layer 2 distal to the substrate 1 in the embodiment of the present disclosure may be arranged in the middle part 22.

This is because the contact parts 21 are in direct contact with the first electrode 61 and the second electrode 62, respectively, and what actually functions as a switching channel in the active layer 2 is the middle part (channel region) 22, and therefore the effect of cracking in the middle part 22 on the electrical performance of the thin film transistor is greater than the effect of cracking in the contact parts 21.

When the substrate is the bendable substrate 1, the thin film transistor can be deformed to a greater extent, so that the groove 23 can play a more effective role, and the curvature radius (for example, R is less than or equal to 1 mm) which can be achieved by the bendable substrate 1 is increased. For convenience, the substrate is the bendable substrate 1 in the following description (it is needless to say that the substrate may be a rigid substrate).

Referring to FIGS. 2 to 4, the bendable substrate 1 may have a predetermined bending direction, that is, the bendable substrate 1 cannot be bent randomly in any direction, but can be bent only in the predetermined bending direction. For example, the predetermined bending direction may be parallel to a first direction C from the first electrode 61 to the second electrode 62. That is, in FIGS. 2 and 3, when the thin film transistor is bent according to the predetermined bending direction, left and right ends thereof may move upwards and then towards the middle part to approach each other, or move downwards and then towards the middle part to approach each other.

Of course, although the predetermined bending direction is parallel to the direction from the first electrode 61 to the second electrode 62 in the embodiment of the present disclosure, the predetermined bending direction of any other direction (for example, a direction perpendicular to the direction from the first electrode 61 to the second electrode 62) may also be applicable.

Alternatively, the groove 23 is a stripe shape, and an extension direction thereof is perpendicular to the direction (i.e., the predetermined bending direction) from the first electrode 61 to the second electrode 62.

It can be seen that, the extension direction of the groove 23 is perpendicular to the predetermined bending direction, when the thin film transistor is bent, the groove 23 can provide a certain bending space, which is equivalent to eliminating the stress concentration phenomenon caused by the bending operation, and therefore, the crack or the fracture is not easily generated.

In order to better reduce the bending stress generated by the active layer 2, the groove 23 may have two opposite side openings in the extension direction, that is, the groove 23 penetrates from one end face of the active layer 2 to the other end face opposite to the one end face, and the schematic structural view thereof is shown in FIG. 4.

Figure 5:
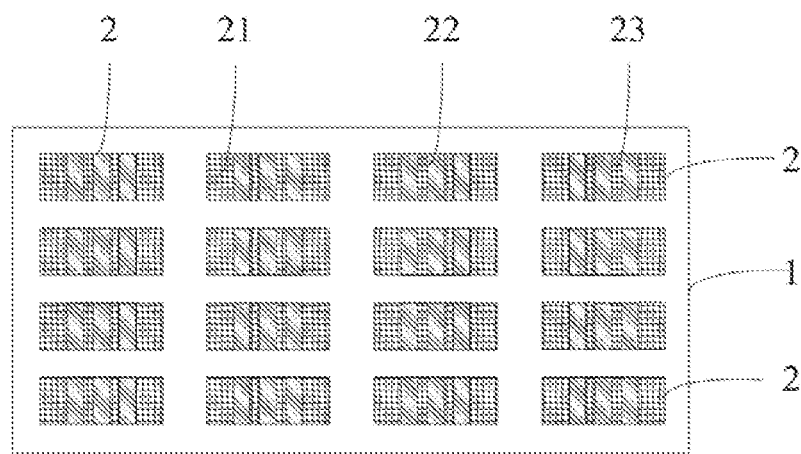
FIG. 5 is a schematic top view of an array of thin film transistors according to an embodiment of the present disclosure.

In addition, width dimensions of the groove bottom a and the groove notch b can be set according to actual needs. For example, the width dimension of the groove notch b is greater than the width dimension of the groove bottom a, and the schematic structural view thereof is shown in FIG. 4. FIG. 5 shows an array of thin film transistors according to an embodiment of the present disclosure.

Alternatively, the groove 23 has a width direction perpendicular to the extension direction, and the dimension of the groove 23 in the width direction is in a range of 8 nm to 500 nm.

In order to reduce the influence of the groove 23 on the electrical performance of the active layer 2 as much as possible, a smaller width of the groove 23 is desirable; but in order to effectively reduce the bending stress suffered by the active layer 2, a larger width of the groove 23 is desirable. Therefore, the above dimension of the groove 23 in the width direction minimizes the bending stress generated by the active layer 2 due to bending on the premise that the influence of the groove 23 on the electrical performance of the active layer 2 is within an acceptable range.

Alternatively, the active layer 2 is provided with a plurality of grooves 23, and the plurality of grooves 23 are arranged at intervals in a direction (i.e., the predetermined bending direction) from the first electrode 61 to the second electrode 62.

According to the above solution, each groove 23 is used for providing a bending space and releasing stress when the active layer 2 around the region where the groove 23 is located is bent, so that more grooves 23 can provide more bending spaces and better release stress when the active layer 2 is bent.

Alternatively, a plurality of grooves 23 are arranged at equal intervals on the active layer 2.

Alternatively, when the groove 23 is of a stripe shape, the extension direction thereof is perpendicular to the direction in which the first electrode 61 points to the second electrode 62.

As shown in FIG. 2, a certain distance exists between the groove bottom a of the groove and the plane of the side of the active layer proximal to the substrate, the distance is greater than 0, a conductivity enhancement structure 24 is arranged on the side of the groove bottom a of the groove proximal to the bendable substrate 1, and the conductivity enhancement structure 24 has conductivity greater than that of the other portions of the middle part 22.

Further, the conductivity enhancement structure 24 penetrates through the active layer 2 in a direction perpendicular to the substrate 1.

It can be seen that, a thickness of the portion of the active layer 2 (in the middle part 22) corresponding to the groove bottom a is thinner than other portions of the active layer 2, so that if this portion includes a same semiconductor as other portions, the actual conductivity of the portion is smaller than that of other portions.

In the embodiments of the present disclosure, the portion of the middle part 22 corresponding to the groove bottom a is set as the conductivity enhancement structure 24 with stronger conductivity. In this way, on one hand, the electrical conductivity of the middle part 22 is maintained identical to that when no groove is provided in the middle part 22, and on the other hand, the electrical conductivity of the various portions of the middle part 22 is ensured identical.

Optionally, the conductivity enhancement structure 24 comprises a conductorized semiconductor material.

In order not to increase the number of layers of the thin film transistor and the difficulty in the manufacturing process of the thin film transistor, the portion of the middle part 22 located at the groove bottom a of the groove may be directly conductorized into the conductivity enhancement structure 24. The orthographic projection of the conductivity enhancement structure on the substrate is positioned in the range of the orthographic projection of the groove on the substrate.

Alternatively, a through groove may be formed in the active layer 2, and a bottom of the through groove is filled with a conductivity enhancement structure, which has a larger conductivity than that of the peripheral active layer.

Optionally, an orthographic projection of the gate 4 on the bendable substrate 1 does not overlap with an orthographic projection of the groove 23 on the bendable substrate 1.

Referring to FIG. 3, the at least one groove divides the active layer 2 into a plurality of regions, and if the groove bottom a is provided with the conductivity enhancement structure 24, this position is not required to be provided with the gate electrode 4, so that the gate electrode 4 may be formed into a plurality of independent structures, namely, only formed at the separate positions without the groove 23, and the gate electrode 4 is not provided at the position provided with the groove 23.

At this time, the interlayer insulating layer 51 formed over the gate electrode 4 may be an organic insulating material, so that the interlayer insulating layer 51 may fill the at least one groove 23 (since there is no gate electrode provided at the groove 23). Of course, the interlayer insulating layer 51 (which may include an organic insulating material) may not be present at the groove 23 at this time, that is, the interlayer insulating layer 51 may not enter the groove 23.

Optionally, the thin film transistor further includes a gate insulating layer 3 arranged on a side of the active layer 2 distal to the bendable substrate 1, a gate electrode 4 arranged on a side of the gate insulating layer 3 distal to the bendable substrate 1, and a part of the gate insulating layer 3 is positioned in the groove 23.

In the above solution, a part of the gate insulating layer 3 is located in the groove 23, and a relief structure is formed along with the groove 23, so that when the gate insulating layer 3 is bent, the bending stress thereon could be dispersed along the relief structure, and therefore, the bending stress applied to the gate insulating layer 3 with the relief structure is smaller than the bending stress applied to the gate insulating layer 3 with the flat structure.

Alternatively, the material of the gate insulating layer 3 may include a high-density material, and a thickness of the gate insulating layer 3 is in a range of 5 nm to 50 nm.

The gate insulating layer 3 serves to isolate the gate electrode 4 from the active layer 2, and therefore, the gate insulating layer 3 has a certain thickness.

The high-density material in the solution refers to a material with a relatively high density.

It can be seen that, in order to achieve a same insulation effect, the thickness required by using a high-density material (e.g., aluminum oxide) is thinner than that of a conventional gate insulating layer 3 (e.g., silicon nitride), and the thickness is smaller than the depth of the groove 23, so as to ensure that the groove 23 still has enough space to accommodate the deformation of the active layer 2 due to the bending of the gate insulating layer 3, and meanwhile, when the thinner gate insulating layer 3 is bent, the internal stress generated by the thinner gate insulating layer is also reduced, thereby reducing the risk of cracking or breaking of the gate insulating layer 3 due to the bending.

Alternatively, the high-density material used for the gate insulating layer 3 may include one or a combination of aluminum oxide ($Al_2O_3$), silicon oxide ($SiO_2$), zirconium oxide ($ZrO_2$), hafnium oxide ($HfO_2$), and titanium oxide ($TiO_2$).

Alternatively, the groove 23 is filled with an organic insulating film 52.

In the above solution, the organic insulating film 52 fills the space in the groove 23, so that the surface of the active layer 2 is relatively flat, which is beneficial to forming other inorganic film layers (e.g. the gate electrode 4) above the groove 23. Meanwhile, the young's modulus of the organic insulating film 52 is much smaller than that of the inorganic insulating film, and the elasticity, toughness and strength of the organic insulating film 52 are better than those of the inorganic insulating film, so that the organic insulating film 52 is filled in the groove 23 without influencing the stress release, and even the bending resistance of the active layer 2 is improved.

Alternatively, the groove 23 is filled with the organic insulating film 52.

Referring to FIG. 2, the groove 23 is filled (leveled) with the organic insulating film 52, and the gate electrode 4 is formed over the organic insulating film 52.

Alternatively, the grooves 23 are formed by a nano-imprint lithography process.

A nano-imprint lithography (NIL) process is the main technology for preparing nano-grooves at present, and can prepare nano-scale patterns in a large area. Meanwhile, the equipment used by the process is simple and has a short preparation time.

A size limit of photolithography in a conventional photolithography technique is at a minimum on the order of micrometers.

In the above, the size of the groove 23 in the width direction thereof is small, for example, in the order of nanometers (nm), and therefore, forming the groove 23 using the nano-imprint lithography process is superior to using the conventional photolithography technique.

Of course, when there is no overlap between the groove 23 and the gate 4, the gate 4 may also be formed by the nano-imprint lithography process. For example, the groove 23 may be formed in the active layer 2 by a nano-imprint lithography process, a material may be filled in the groove and planarized, then a gate material layer may be formed on the planarized material, a photoresist may be coated on the gate material layer to be patterned again by a nano-imprint lithography process, and a portion of the gate material layer corresponding to the groove 23 and the filled material may be removed to form the gate electrode 4.

Referring to FIGS. 2 to 4, an embodiment of the present disclosure further provides a method for manufacturing a thin film transistor according to the above embodiment, and the method includes:

S301, preparing a substrate (e.g., a bendable substrate 1).

S302, forming an active layer 2 on the substrate, and forming at least one groove 23 on a surface of the active layer 2 distal to the substrate.

Alternatively, the at least one groove 23 may be formed by a nano-imprint lithography process.

Figure 6:
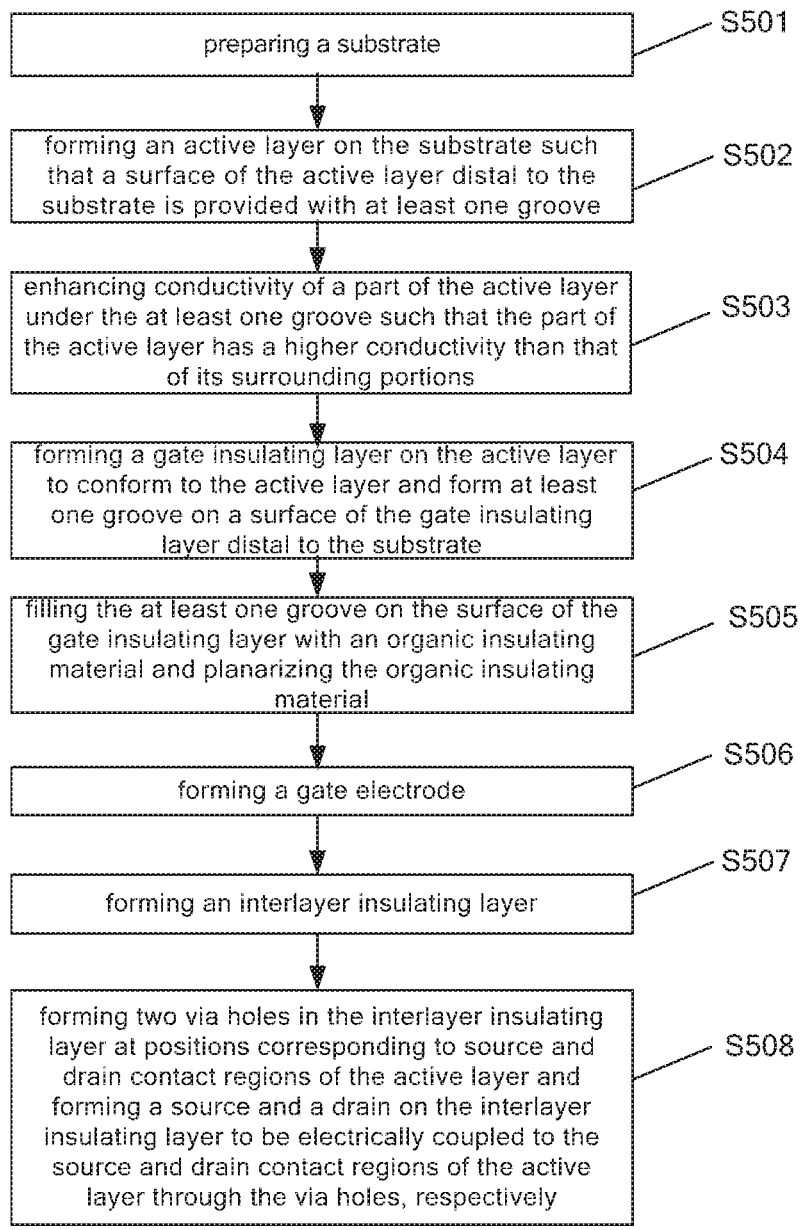
FIG. 6 is a flowchart of a method for manufacturing a thin film transistor according to an embodiment of the present disclosure.

For the thin film transistor shown in FIG. 2, for example, the manufacturing method shown in FIG. 6 could be adopted, and the manufacturing method includes:

S501, preparing a substrate (e.g., a bendable substrate 1);

S502, forming an active layer 2 on the substrate 1 such that a surface of the active layer 2 distal to the substrate 1 is provided with at least one groove 23;

S503, enhancing conductivity of a part of the active layer 2 under the at least one groove 23 such that the part of the active layer 2 has a higher conductivity than that of its surrounding portions;

S504, forming a gate insulating layer 3 on the active layer 2 to conform to the active layer 2 and form at least one groove 23 on a surface of the gate insulating layer 3 distal to the substrate;

S505, filling the at least one groove on the surface of the gate insulating layer 3 with an organic insulating material and planarizing the organic insulating material;

S506, forming a gate electrode 4;

S507, forming an interlayer insulating layer 51; and

S508, forming two via holes in the interlayer insulating layer 51 at positions corresponding to source and drain contact regions of the active layer and forming a source electrode 61 and a drain electrode 62 on the interlayer insulating layer to be electrically coupled to the source and drain contact regions of the active layer through the via holes, respectively.

Figure 7:
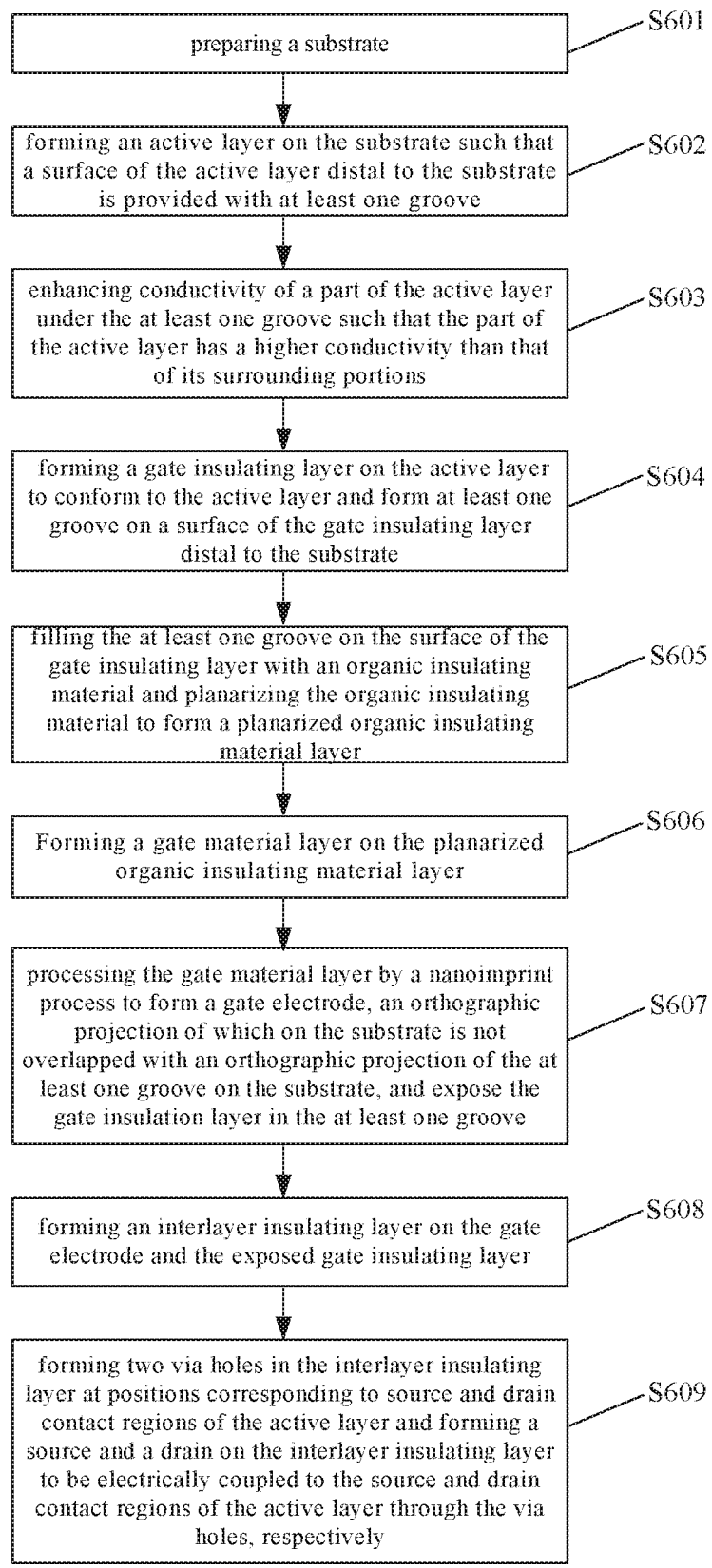
FIG. 7 is a flowchart of a method for manufacturing a thin film transistor according to an embodiment of the present disclosure.

For the thin film transistor shown in FIG. 3, the manufacturing method shown in FIG. 7 can be adopted, and the manufacturing method includes:

S601, preparing a substrate (e.g., a bendable substrate 1).

S602, forming an active layer 2 on the substrate 1 such that a surface of the active layer 2 distal to the substrate 1 is provided with at least one groove 23;

S603, enhancing conductivity of a part of the active layer under the at least one groove 23 such that the part of the active layer has a higher conductivity than that of its surrounding portions;

S604, forming a gate insulating layer 3 on the active layer 2 to conform to the active layer 2 and form at least one groove on a surface of the gate insulating layer 3 distal to the substrate 1;

S605, filling the at least one groove on the surface of the gate insulating layer with an organic insulating material and planarizing the organic insulating material to form a planarized organic insulating material layer;

S606, forming a gate material layer on the planarized organic insulating material layer;

S607, processing the gate material layer by a nanoimprint process to form a gate electrode 4, an orthographic projection of which on the substrate is not overlapped with an orthographic projection of the at least one groove on the substrate, and expose the gate insulation layer 3 in the at least one groove;

S608, forming an interlayer insulating layer 51 on the gate electrode and the exposed gate insulating layer;

S609, forming two via holes in the interlayer insulating layer 51 at positions corresponding to source and drain contact regions of the active layer and forming a source electrode 61 and a drain electrode 62 on the interlayer insulating layer to be electrically coupled to the source and drain contact regions of the active layer through the via holes, respectively.

Referring to FIGS. 2 to 4, an array substrate including a plurality of thin film transistors including the thin film transistor described in the above embodiments is also provided in an embodiment of the present disclosure.

Using the thin film transistor disclosed in the embodiment, the probability of damage of the thin film transistor due to bending is reduced, so that the bending resistance of the array substrate is improved, and the service life of the array substrate is prolonged.

Optionally, the substrate is a bendable substrate 1 and has a predetermined bending direction, and the groove 23 formed in the active layer is strip-shaped and has an extension direction, and the extension direction is perpendicular to the predetermined bending direction.

That is, when the bendable substrate 1 having the predetermined bending direction is used, the extension direction of the groove 23 may be perpendicular to the predetermined bending direction to better release the stress.

Of course, the predetermined bending direction may be parallel to a direction in which the first electrode 61 of the thin film transistor is directed towards the second electrode 62.

The embodiment of the present disclosure provides a display device, which includes the array substrate of the above embodiment.

Specifically, the display device may be any product or component having a display function, such as a liquid crystal display panel (LCD), an organic light emitting diode (OLED) display panel, electronic paper, a mobile phone, a tablet computer, a television, a display, a notebook computer, a digital photo frame, and a navigator.

It should be noted that, in this description, relational terms such as first and second, and the like are used solely to distinguish one entity or action from another entity or action without necessarily requiring or implying any actual such relationship or order between such entities or actions. Also, the terms "includes", "including", or any other variation thereof, are intended to cover a non-exclusive inclusion, such that a process, method, article, or apparatus that includes a list of elements does not include only those elements but may include other elements not expressly listed or inherent to such process, method, article, or apparatus. Without further limitation, an element defined by the phrase "including an . . . " does not exclude the presence of other identical elements in the process, method, article, or apparatus that includes the element.

In accordance with the embodiments of the present disclosure, as set forth above, these embodiments are not exhaustive of all details, nor are they limiting the disclosure to the specific embodiments described. Obviously, many modifications and variations of the described embodiments are possible in light of the above teachings. The embodiments were chosen and described in order to best explain the principles of the disclosure and the practical application, to thereby enable others skilled in the art to best utilize the disclosure and various embodiments with various modifications as are suited to the particular use contemplated. The present disclosure is to be limited only by the claims and their full scope and equivalents.

What is claimed is:

1. A thin film transistor, comprising: a substrate and an active layer disposed on the substrate, wherein a surface of the active layer distal to the substrate is provided with at least one groove and a depth of the at least one groove penetrating through the active layer is larger than half of a thickness of the active layer in a direction perpendicular to the substrate;

wherein the thin film transistor further comprises a first electrode and a second electrode, the active layer comprises two contact parts respectively in contact with the first electrode and the second electrode, and a middle part positioned between the two contact parts, and the middle part is a channel region of the thin film transistor;

orthographic projections of the two contact parts on the substrate are not overlapped with an orthographic projection of the middle part on the substrate; and the at least one groove is disposed in the middle part;

wherein the thin film transistor further comprises a gate insulating layer disposed on a side of the active layer distal to the substrate and a gate electrode disposed on a side of the gate insulating layer distal to the substrate, the at least one groove comprises a plurality of grooves, which are arranged at intervals along a direction pointing from the first electrode to the second electrode, and an orthographic projection of the gate electrode on the substrate is not overlapped with an orthographic projection of the at least one groove on the substrate.

2. The thin film transistor of claim 1, wherein the at least one groove is of a stripe shape extending in an extension direction perpendicular to a direction pointing from the first electrode to the second electrode; and a distance between a bottom of the at least one groove and a plane where a side of the active layer proximal to the substrate is located is larger than 0, a conductivity enhancement structure is arranged between the bottom of the at least one groove and the side of the active layer proximal to the substrate, the conductivity enhancement structure has conductivity larger than that of other portions of the middle part, and an orthographic projection of the conductivity enhancement structure on the substrate is located in a range of an orthographic projection of the at least one groove on the substrate.

3. The thin film transistor of claim 1, wherein the at least one groove is a stripe shape extending in an extension direction perpendicular to a direction pointing from the first electrode to the second electrode; and the at least one groove penetrates through the active layer in the extension direction, a conductivity enhancement structure is filled at a bottom of the at least one groove, the conductivity enhancement structure penetrates through the active layer along a direction perpendicular to the substrate, and a depth of the conductivity enhancement structure in the direction perpendicular to the substrate is less than half of a largest thickness of the active layer in a direction perpendicular to the substrate.

4. The thin film transistor of claim 3, wherein the conductivity enhancement structure comprises a conductorized semiconductor material.

5. The thin film transistor of claim 2, wherein the at least one groove has a width direction perpendicular to the extension direction, and a dimension of the at least one groove in the width direction is in a range of 8 nm to 500 nm.

6. The thin film transistor of claim 1, wherein an overlapping portion between an orthographic projection of the gate insulating layer on the substrate and an orthographic projection of the at least one groove on the substrate is located in the at least one groove.

7. The thin film transistor of claim 6, wherein a material of the gate insulating layer comprises one or a combination of aluminum oxide ($Al_2O_3$), silicon oxide ($SiO_2$), zirconium oxide ($ZrO_2$), hafnium oxide ($HfO_2$) and titanium oxide ($TiO_2$), and a thickness of the gate insulating layer is in a range of 5 nm to 50 nm.

8. The thin film transistor of claim 6, wherein the at least one groove is filled with an organic insulating material.

9. The thin film transistor of claim 6, further comprising an interlayer insulating layer on a side of the gate electrode distal to the substrate, wherein the first electrode and the second electrode are on a side of the interlayer insulating layer distal to the substrate, wherein the first electrode and the second electrode are electrically coupled to the active layer through via holes in the active layer, respectively.

10. An array substrate, comprising a plurality of thin film transistors, wherein each of the plurality of thin film transistors is the thin film transistor of claim 1.

11. The array substrate of claim 10, wherein the substrate is a bendable substrate and is provided with a preset bendable direction, and an extension direction of the at least one groove is perpendicular to the preset bendable direction.

12. A display device, comprising the array substrate of claim 10.

13. A method for manufacturing a thin film transistor, comprising:

preparing a substrate; and forming an active layer on the substrate such that a surface of the active layer distal to the substrate is provided with at least one groove and a depth of the at least one groove penetrating through the active layer is larger than half of a thickness of the active layer in a direction perpendicular to the substrate, and the active layer comprises two contact parts respectively in contact with a first electrode and a second electrode of the thin film transistor, and a middle part positioned between the two contact parts, and the middle part is a channel region of the thin film transistor;

orthographic projections of the two contact parts on the substrate are not overlapped with an orthographic projection of the middle part on the substrate; and the at least one groove is disposed in the middle part; and the method further comprises comprising forming a gate insulating layer on the active layer to conform to the active layer and form at least one groove on a surface of the gate insulating layer distal to the substrate such that the at least one groove comprises a plurality of grooves, which are arranged at intervals along a direction pointing from the first electrode to the second electrode;

filling the at least one groove on the surface of the gate insulating layer with an organic insulating material, and planarizing the organic insulating material to form a planarized organic insulating material layer;

forming a gate material layer on the planarized insulating material layer;

processing the gate material layer by a nano-imprint lithography process to form a gate electrode, an orthographic projection of which on the substrate is not overlapped with an orthographic projection of the at least one groove on the substrate and expose the gate insulation layer in the at least one groove.

14. The method of claim 13, wherein the forming the active layer comprises forming the at least one groove on the surface of the active layer distal to the substrate by a nano-imprint lithography process.

15. The method of claim 14, further comprising forming an interlayer insulating layer on the gate electrode and the exposed gate insulating layer.

16. The method of claim 15, wherein after forming an active layer on the substrate such that a surface of the active layer distal to the substrate is provided with at least one groove, the method further comprises:

enhancing conductivity of a portion of the active layer under the at least one groove to form a conductivity enhancement structure filled at a bottom of the at least one groove such that the conductivity enhancement structure has a higher conductivity than that of its surrounding portions, the conductivity enhancement structure penetrates through the active layer in an extension direction perpendicular to a direction pointing from the first electrode to the second electrode and penetrates through the active layer along a direction perpendicular to the substrate, and a depth of the conductivity enhancement structure in the direction perpendicular to the substrate is less than half of a largest thickness of the active layer in a direction perpendicular to the substrate.

* * * * *